(12) United States Patent
Carpenter, Jr. et al.

(10) Patent No.: US 6,407,626 B1
(45) Date of Patent: Jun. 18, 2002

(54) ANALOG FILTERING WITH SYMMETRICAL TIMING USING A SINGLE COMPARATOR

(75) Inventors: John H. Carpenter, Jr., Rowlett; Joseph A. Devore, Richardson; Tohru Tanaka, Dallas; Ross E. Teggatz, McKinney, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/715,759

(22) Filed: Nov. 17, 2000

Related U.S. Application Data

(60) Provisional application No. 60/174,134, filed on Dec. 31, 1999.

(51) Int. Cl.$^7$ ................................................. H03K 5/00
(52) U.S. Cl. ........................ 327/552; 327/554; 327/337
(58) Field of Search ................................. 327/551, 552, 327/336, 337, 554

(56) References Cited

U.S. PATENT DOCUMENTS 5,416,438 A * 5/1995 Shibata ........................ 327/552
6,229,384 B1 * 5/2001 Matsumoto ................... 327/67

* cited by examiner

*Primary Examiner*—Dinh T. Le
(74) *Attorney, Agent, or Firm*—Pedro P. Hernandez; W. James Brady, III; Frederick J. Telecky, Jr.

(57) ABSTRACT

Provided is a symmetrical filter that uses a single comparator. In addition to a voltage divider, a current regulator, and a comparator, the filter of the invention provides control logic that turns on or off a pull up switch and/or pull down switch in order to fully charge or fully discharge a capacitor. Accordingly, in one aspect, the invention is a control logic for a symmetrical filter. Furthermore, timing logic is provided to provide for a more rigorous symmetrical filter performance.

17 Claims, 3 Drawing Sheets

US 6,407,626 B1

ANALOG FILTERING WITH SYMMETRICAL TIMING USING A SINGLE COMPARATOR

This application claims priority under 35 USC §119 (e)(1) of Provisional Application No. 60/174,134, filed Dec. 31, 1999.

TECHNICAL FIELD OF THE INVENTION

Present invention relates generally to analog circuit and mixed signal circuits, and more specifically, to implementing a symmetrical filter in an analog or mixed signal circuit using a single comparator.

BACKGROUND

Analog signals in circuits are typically voltages that have the ability to vary continuously between two voltages, known as rails. Accordingly, circuits that process only analog signals are called analog circuits.

In contrast, digital signals and circuits are typically discreet, predefined voltages, such that a voltage (V) signal will be interpreted as being nearest discreet, predefined voltage. For example, some computers are digital circuits (meaning circuits that process only digital signals) that operate at the discreet, predefined voltages of 0 v and 5 v. Then, if a voltage signal is received of 0.4 v, it is interpreted as the nearest discreet, predefined voltage, which is in this case 0 v. When using two discreet, predefined voltages, the digital circuit is said to be binary. Generally, for logic evaluation purposes, the higher of the two discreet, predefined voltages is called 1 and the lower of the two discreet predefined voltages is called 0.

Mixed signal circuits (MXCs) combined elements of both analog signal processing and digital signal processing. Often, but not always, MXCs are employed at the boundary between an analog circuit and a digital circuit where they are used to convert an analog signal into a digital signal and/or used to change a digital signal to an analog signal.

Since light, sound, and other stimuli that make up the environment are mostly analog in nature, while most computer processing is digitized, and since MXCs carry signals between the (real world) which is mostly analog, and the computer world, which is primarily digital, MXCs are used in a variety of products. For example, the telecommunications industry utilizes MXCs to transfer sound between the real world of voice and the digital world of telephone networks, such as a Public Land Mobile Network (PLMN), for example. Likewise, cellular telephones and other devices that use transceivers incorporate MXCs to translate between analog signals used in analog circuits and the digital signals used in digital circuits.

Within a MXC or an analog circuit, a symmetrical filter (the filter) may be used to remove or separate noise from the circuit, and to produce a discreet, predefined digital output voltage in either a digital input voltage or an analog input voltage. Symmetrical filters are often preferred over other types of filters because symmetrical filters provide a rise time and a fall time which are the same, as discussed below. FIG. 1 (prior art) is a circuit diagram of a prior art filter.

The filter uses a comparator in order to produce a discreet, predefined digital output voltage that is equivalent to a supply voltage (Vsup) when a voltage on a capacitor (Vcap) is greater than a reference voltage (Vref), and equivalent to a ground voltage (Vgnd) when the Vcap is less that Vref. Vref is provided by a voltage divider which is comprised of a first resistor 70 and a second resistor 80. Typically, the first resistor 70 and the second resistor 80 are of the same resistance value, and the voltage divider is placed across Vsup and Vgnd. Accordingly, the reference voltage is typically the median value of the Vsup and the Vgnd.

Vcap is provided by a capacitor 30. With the input voltage (Vin) is greater than the Vcap, an inverter 50 which functions as a switch, allows a first current source 10 to charge the capacitor 30. Likewise, when Vin is less that Vcap, inverter 50 allows a second current source 20 to drain a charge from the capacitor 30.

Unfortunately, symmetrical filters configured according to the prior art suffer from several drawbacks. For example, a MXC may define an input voltage to be noise if Vin lasts for fewer than 20 microseconds (us). FIG. 1a (prior art) is a timing diagram illustrating selected voltage values in the Prior art symmetrical filter illustrated in FIG. 1. Time in microseconds is illustrated across the horizontal axis, while voltage and volts is illustrated across the vertical axis. Vin is illustrated with dotted lines, Vcap is illustrated as a solid line having generally pyramid shaped rises and falls, and Vout is illustrated as a solid line having practically instantaneous rises and falls. When Vin, Vout, and Vcap have a value of 0 volts, it should be noted that in FIG. 1a the graph of these voltages will result in line which appear to have voltages around but not approximately equal to 0 volts. It should be understood that this plotting of voltage values is done intentionally so that the viewer of FIG. 1a may differentiate Vin, Vout, and Vcap when Vin, Vout, and Vcap each equal 0 volts. Likewise, Vin, Vout, and Vcap are shown in a similar manner when Vin, Vout, or Vcap equal 5 volts. Furthermore, for purposes of FIG. 1a, Vref is assumed to be equal to 0 volts and Vsup is assumed to be equal to 5 volts.

Accordingly, at time $T_0$ equals 0 microseconds Vin, Vout, and Vcap are all equal to 0 volts. Then, at $T_1$, an input voltage is received and Vin is said to go high. When Vin goes high, the capacitor 30 begins to charge as is illustrated by Vcap beginning to rise in value at $T_1$, since the switch 50 will charge the capacitor 30 when the switch 50 receives the high Vin voltage. Next, at $T_2$, Vin again returns to 0 volts (or is said to go low) which causes the switch 50 to cease charging the capacitor 30. Accordingly, also at T=2, Vcap will again begin returning to 0 as the capacitor 30 discharges to 0 volts at time $T_3$. From $T_1$ to $T_2$ Vin was not high long enough for Vcap to rise above Vref which is set at 2.5 volts. Thus, the pulse produced by Vin between $T_1$ and $T_2$ is considered noise, and is in FIG. 1a properly filtered and prevented from producing an output voltage Vout.

At $T_4$, Vin again goes high to 5 volts and Vcap again begins to rise. Then, at $T_5$, Vcap has risen to where the Vcap is equal to Vref. Accordingly, the comparator 90 detects that Vcap is now greater than Vref and thus produces Vout at 5 volts. Then, at $T_6$, Vin goes low to 0 volts and the voltage on the capacitor begins discharging since the switch 50 receives Vin at 0 volts and Vcap thus begins to fall. As long as Vcap remains above Vref, Vout remains high at 5 volts. However, when Vcap falls below Vref, Vout falls low to 0 volts, which is shown at time $T_7$. Then, Vcap continues to fall to 0 volts at time $T_8$. Note that Vin between time $T_4$ and $T_6$ is not interpreted as noise and should ideally result in a Vout having a duration equivalent to Vin. Unfortunately, due to the rise and fall time of Vcap, Vout is considerably shorter in duration than Vin. And, should the time that Vout is high be less than 20 microseconds, other circuit logic may interpret Vout to be noise. The misinterpretation of a proper Vin as noise could result in circuit errors. At time $T_9$, Vin goes high to 5 volts and again the capacitor 30 begins charging so that Vcap begins rising. Then, at time $T_{10}$, Vcap becomes greater than Vref thus triggering the comparator 90 to product Vout of 5 volts. At time $T_{11}$, Vcap reaches 5 volts, indicating that the voltage across the capacitor 30 has reached 5 volts and that the capacitor 30 is fully charged. Accordingly, when the capacitor 30 is fully charged at 5 volts, Vout will remain high and no further charge can be placed on the capacitor 30. Next, at time $T_{12}$, Vin goes low to 0 causing the capacitor 30 to begin to discharge as shown by the falling of Vcap. Next, at $T_{13}$, Vcap falls below Vref thus triggering the comparator 30 to produce Vout of 0 volts. Therefore, Vcap continues to fall until the capacitor 30 is fully discharged and Vcap is at 0 volts at time $T_{14}$. Since Vout has the same duration as Vin between time $T_9$ and $T_{13}$, the prior art circuit shown in FIG. 1 has correctly filtered Vin. Thus, FIG. 1a illustrates one problem with the prior art, which is that errors may be produced when Vin changes from a high to a low value just after Vcap rises above Vref and before the capacitor is fully charged.

Furthermore, if the Vin PWM is at something greater than 50 percent (relative to the current output state), the filter will eventually charge (or discharge) the capacitor and toggle the output to an improper state. Therefore, it would be advantageous to provide a symmetrical filter that overcomes problems associated with Vcap beginning to fall just after passing Vref, as well as overcoming the problems associated with PWMing.

SUMMARY OF THE INVENTION

The present invention provides technical advantages as a symmetrical filter (Vswitch) that uses a simple comparator. The filter generally includes a control logic that either pulls up an output voltage or pulls down an output voltage to a predefined, discreet value, a capacitor capable of insuring that the output voltage is held for a predefined time period, and a first and a second filter that control the placement of a charge on the capacitor. Accordingly, the control logic defines a separate circuit. Likewise, a timing logic insures proper filtering of noise on an input voltage node. Thus, the present invention provides a symmetrical filtering using a single comparator, which reduces the use of integrated circuit (IC) space. In addition, the invention illuminates filtering problems associated with prior art Single Comparator Symmetrical Filters and eliminates problems associated with PWMing on the input voltage node.

In one embodiment, the present invention is a symmetrical filter. The symmetrical filter generally comprises a comparator selectively coupled to a supply voltage node, a ground voltage node, a capacitor voltage node, and a reference voltage node. The symmetrical filter also includes a voltage divider, as well as a current supply and an inverter set. Furthermore, the symmetrical filter includes control logic including a pull up switch coupled between the voltage supply node and the capacitor voltage node, and a pull down switch coupled between the ground voltage node and the capacitor voltage node. In addition, the control logic includes a NAND gate which uses an output voltage from the comparator as well as the input voltage to control the pull up switch, and a NOR gate which also uses the output of the comparator and in the input voltage to control the pull down switch.

In another embodiment, the present invention is a logic block for controlling the output of a symmetrical filter. The logic block generally comprises control logic which is connected to an output node and an input node, as well as a pull up switch and a pull down switch. The control logic could include a first inverter coupled between the input and an intermediate node, and a second inverter coupled between the intermediate node and a logic block. The logic block could comprise an NAND gate having a first input coupled to the second inverter, a second input coupled to the output node and an output connected to the pull up switch. Furthermore, the logic block could comprise a NOR gate having a first input coupled to the second inverter, a second input coupled to the output node, and an output connected to the pull down switch.

In yet another embodiment, the invention is a logic block for controlling the output of a symmetrical filter which incorporates a timing logic coupled to a first filter, a second filter, and a control logic. The timing logic could be implemented as flip-flops configured to delay an input signal processing for a predetermined number of clock cycles, for example, two clock cycles.

BRIEF DESCRIPTION OF THE DRAWINGS

Other aspects of the invention, including alternative embodiments, are understood by reference to the following Detailed Description of a Preferred Embodiment, which can be better understood by reference to the drawings, in which:

FIG. 2a is a timing diagram that illustrates how the symmetrical figure of FIG. 2 will process the Vin signals which were placed on the prior art filter in FIG. 1a.

DETAILED DESCRIPTION OF A PREFERRED EMBODIMENT

The present invention provides proper filtering of noise on an input node through a symmetrical filter which uses a single comparator, thus reducing the use of integrated circuit (IC) space. In addition, the invention eliminates the filtering problems associated with prior art symmetrical filters, and eliminates PWM problems on the input node. Accordingly, the invention generally includes a control logic that either pulls up or pulls down an output voltage to a predefined, discreet value. In addition, the filter includes a capacitor, and a first and second switch that enable the maintaining of an output voltage for a predetermined period of time. In addition, a timing logic guarantees the symmetrical filter's integrity and insures the proper filtering of noise which may occur on the input node.

Figure 2A:
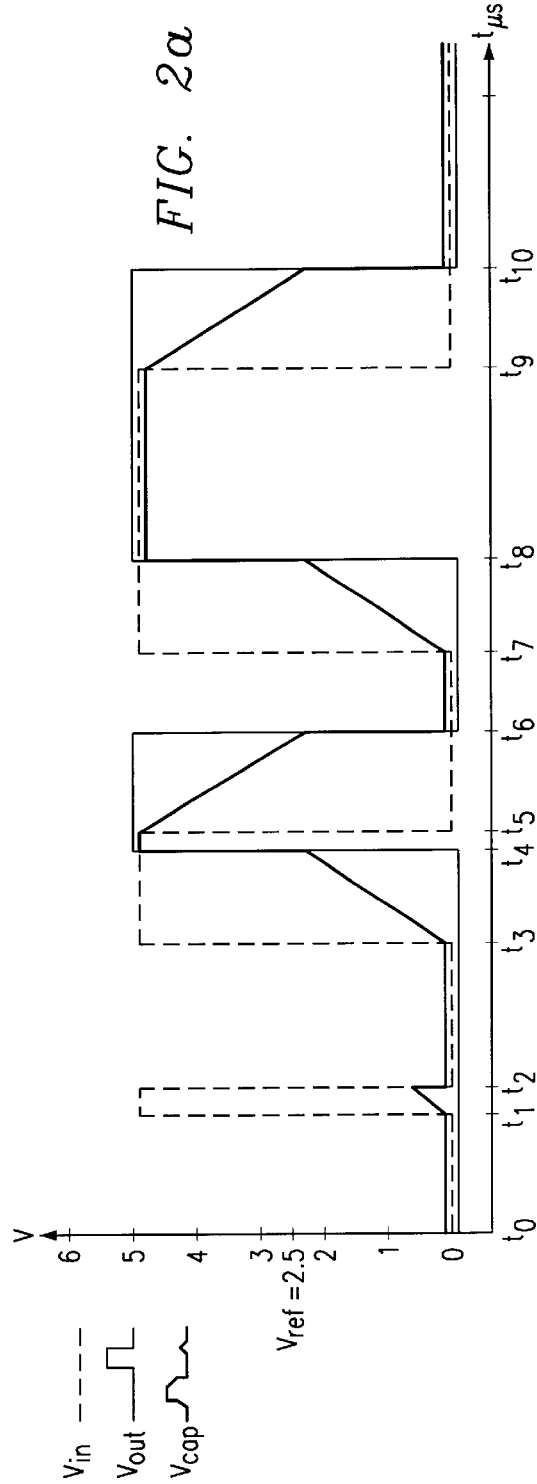
Figure 2:
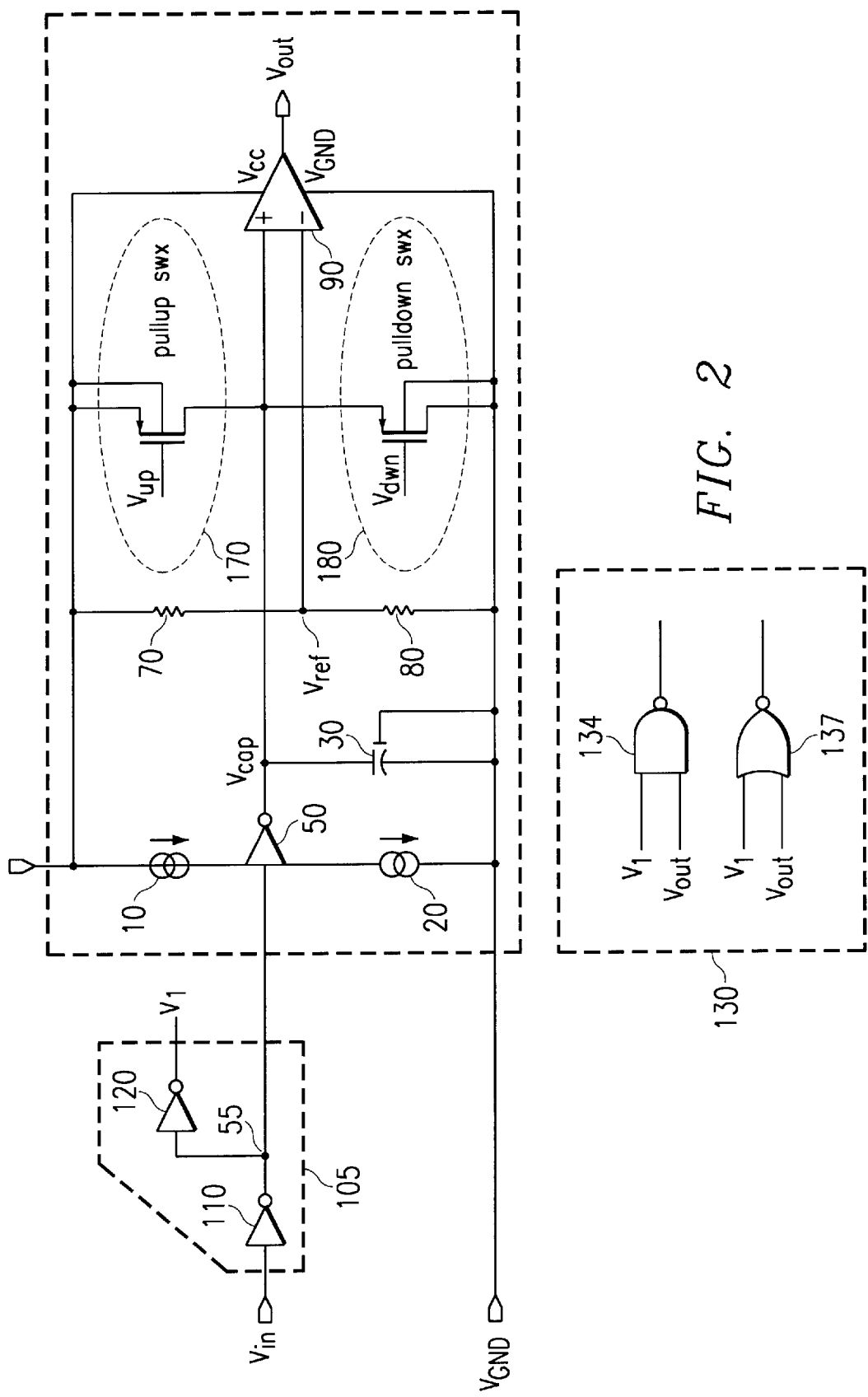
FIG. 2 is a circuit schematic of a symmetrical filter (the filter) according to the teachings of the present invention.

Within a mixed signal circuit (MXC) or an analog circuit, a symmetrical filter may be used to produce a discrete, predefined digital output voltage (Vout) from either digital input voltage or an analog input voltage. FIG. 2 is a circuit schematic of a symmetrical filter (the filter) according to the teachings of the present invention.

The filter uses a comparator 90 to produce a discrete, predefined digital output voltage that is equivalent to a supply voltage (Vsup) when a voltage on a capacitor (Vcap) is greater than a reference voltage (Vref), and equivalent to a ground voltage (Vgnd) when the Vcap is less than the Vref. Vref is provided by a voltage divider, which is coupled between Vsup and Vgnd and which is comprised of a first resistor 70 and a second resistor 80. It should be noted, however, that although the voltage divider is illustrated as comprising resistors, the voltage divider could comprise a plurality of resistors or other electronic subcomponents, such as transistors. Typically, the first resistor 70 and the second resistor 80 are of the same resistance value, and the voltage divider is placed across Vsup and Vgnd. Accordingly, Vref is typically approximately a medium value between the Vsup and the Vgnd.

The charge Vcap is provided by a capacitor 30, which is preferably 50 pS. If the Vin is greater than the Vcap, the switch 50, which is implemented as an inverter in the present embodiment, allows a current regulator to charge the capacitor 30. Likewise, when Vin is less than Vcap, the inverter 50 allows the current regulator to drain charge from the capacitor 30. In the present embodiment, the current regulator is implemented as a first current source which is coupled between Vsup and the inverter 50, and a second current source 20 which is coupled between the inverter 50 and Vgnd. The first current source supplies a current to the capacitor 30, and the second current source 20 drains the current from the capacitor 30.

In order to quickly pull Vcap high, a pull up switch 170 is coupled between Vsup and Vcap. The pull up switch is preferably PMOS and also coupled to a logic block 130, and more specifically, to an output of a NAND gate 134. Similarly, to pull Vcap down quickly to ground, a pull down switch 180 is provided coupled between Vcap and Vgnd. The pull down switch 180 is preferably an nmos switch, and is also coupled to a NOR gate 137 within the logic block 130.

The logic block 130 receives an input as a feedback loop from the output voltage Vout of the comparator 90. The logic block 130 also receives an input from an invertor block 105 which in FIG. 2 is comprised of a first invertor 110 coupled between an input node having an input voltage Vin and an intermediate node 55 as well as a second invertor 120 coupled between the intermediate node 55 and the NAND gate 130 and the NOR gate 137.

Figure 1A:
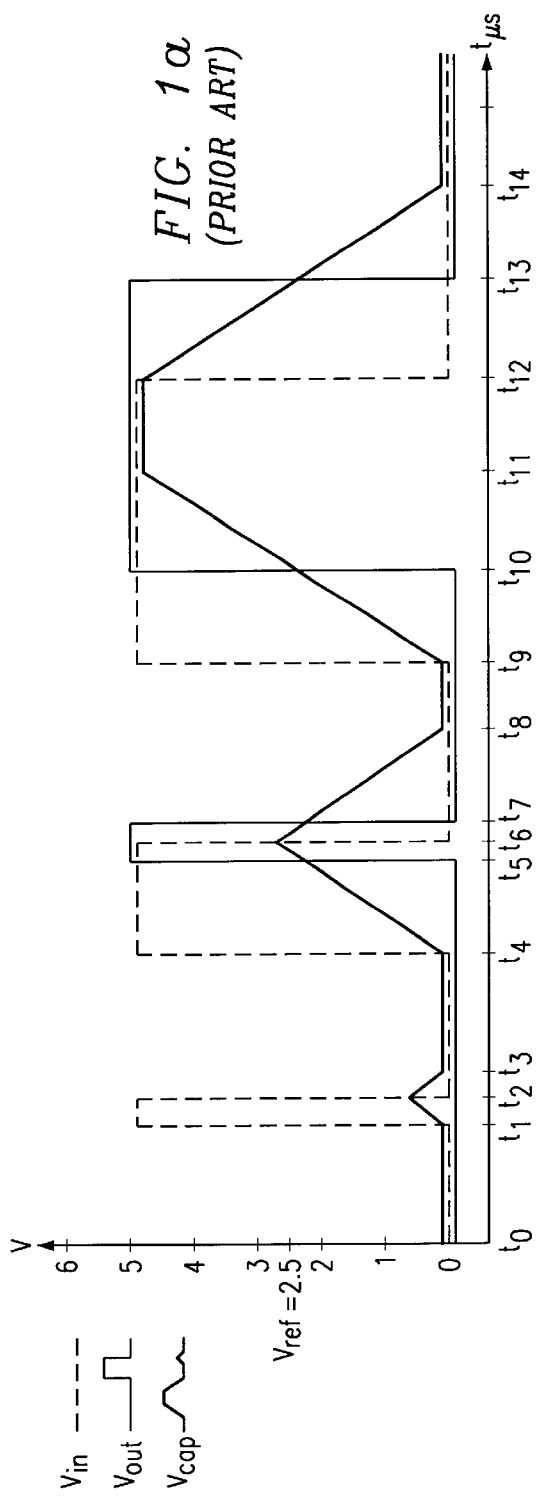
FIG. 1a (prior art) is a timing diagram illustrating selected voltage values in the prior art symmetrical filter.

Some of the advantages of using the present invention device illustrated in FIG. 2 may be realized by viewing a timing diagram. Accordingly, FIG. 2a is a timing diagram that illustrates how the symmetrical figure of FIG. 2 will process the Vin signals which were placed on the prior art filter in FIG. 1a. Accordingly, FIG. 2a illustrates time and microseconds across a horizontal axis as well as voltages in volts across a vertical axis. Furthermore, voltages which are graphed around zero volts should be understood to be at approximately zero volts and are graphed around zero volts only so that the viewer may more easily distinguish Vin from Vout from Vcap. Likewise, when voltages are illustrated horizontally around 5 volts in FIG. 2a, it should be understood that the voltages are intended to be approximately 5 volts and are illustrated around five volts so that the viewer may more easily distinguish Vin from Vout from Vcap.

At $T_0$, Vin, Vout, and Vcap all equal to zero and will be equal to zero until time $T_1$. At time $T_1$ the end goes high to 5 volts and Vcap begins to charge as illustrated by the line ramping upwards at $T_1$. Accordingly, as Vcap ramps upward it should be understood that the capacitor in the filter is charging. Vin remains at 5 volts until time $T_2$ when Vin falls to zero volts. Then, also at $T_2$, Vcap ceases to rise and immediately falls to zero volts. The immediate fall of Vcap is a result of Vout being low, as well as Vin being low, resulting in the input to the NOR gate 137 being low and the output of the NOR gate activating the pull down switch 180, when the pull down switch 180 is activated Vcap almost immediately falls to the filter's lower voltage, which in this case is Vgnd. Thereafter, Vin, Vout, and Vcap remain at the low voltage zero until time $T_3$.

At time $T_3$ Vin goes high again to 5 volts and remains high until time $T_5$ at which time Vin returns to zero. At time $T_3$ Vcap begins ramping upward and continues ramping upward until Vcap is greater than Vref which occurs at time $T_4$. At $T_4$ Vcap almost immediately rises to 5 volts. This is accomplished because Vout is high at time $T_4$, and because Vin is high at $T_4$. Accordingly, when Vout is high and Vin is high the NAND gate 134 output turns on the pull up switch 170. Then, when the pull up switch 170 is turned on, Vcap almost immediately rises to the supply voltage level. The supply voltage which is in this case 5 volts, is maintained on the capacitor 30 and keeps Vcap high until time $T_5$ when Vin goes low; thus, causing the output of the NAND gate 134 to turn off the pull up switch 170. This means at time $T_5$ Vcap begins to ramp downward as the charge in the capacitor 30 discharges. Vcap will continue to ramp down until Vcap is lower than the reference voltage which in this case is 2.5 volts, and of course, at time $T_6$. Then, at time $T_6$ Vcap almost immediately falls to the ground voltage due to the output of the NOR gate 137 turning on the pull down switch 180 as discussed earlier. Thus, also at time $T_6$ the output voltage almost immediately falls to zero volts. Once again, Vin, Vout, and Vcap remain at zero volts between time $T_6$ and $T_7$.

At time $T_7$ Vin again goes high and Vcap again begins to ramp upward until time $T_8$ when Vcap becomes greater than Vref and almost instantaneously jumps to 5 volts. Thus, also at time $T_8$ the output voltage almost instantaneously jumps to 5 volts as well. Thereafter, Vin remains high until time $T_9$ when Vin falls back to zero volts and when Vcap begins to ramp downward again. Vcap continues to ramp downward to time $T_{10}$ when Vcap falls below Vref which causes Vout to go low and since Vout is low and Vin is low, the output of the NOR gate 137 turns on the pull down switch 180 and sends Vcap almost instantaneously down to zero volts. Thereafter, Vin, Vout, and Vcap are illustrated as zero volts. For purposes of FIG. 2a, it may be assumed that the time between time $T_0$ and time $T_3$ is 100 microseconds. Furthermore, one should note that since Vcap is almost immediately ramped up to 5 volts at time $T_4$, the time it takes for the capacitor of the filter to discharge such that Vcap is lower than Vref results in an output voltage being maintained high for the time $T_5$ to $T_6$. The means that Vout is maintained high for approximately the same time Vin is maintained high. In other words, Vin is interpreted as a signal rather than as noise, in the output Vout is approximately symmetrical to the input voltage Vin. This illustrates how prompt the present invention solves problems associated with Vcap beginning to discharge shortly after Vcap exceeds Vref.

Figure 1:
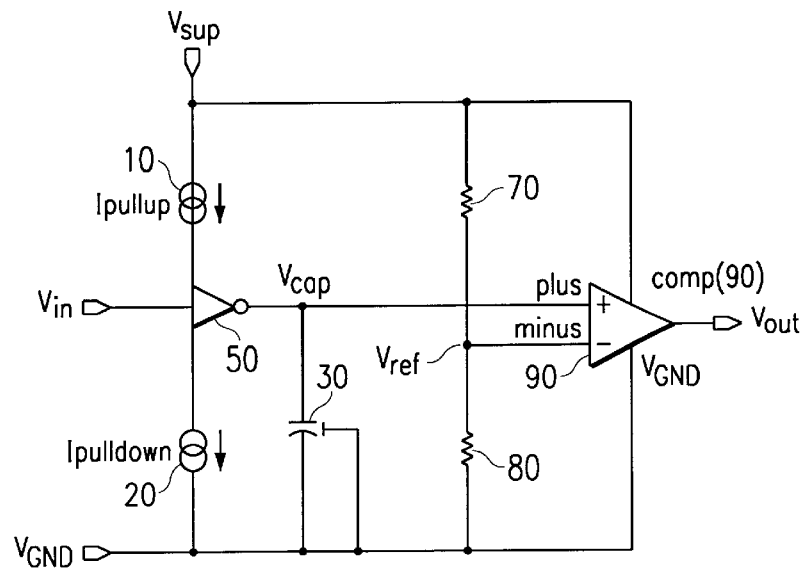
FIG. 1 (prior art) is a circuit diagram of a prior art filter.
Figure 3:
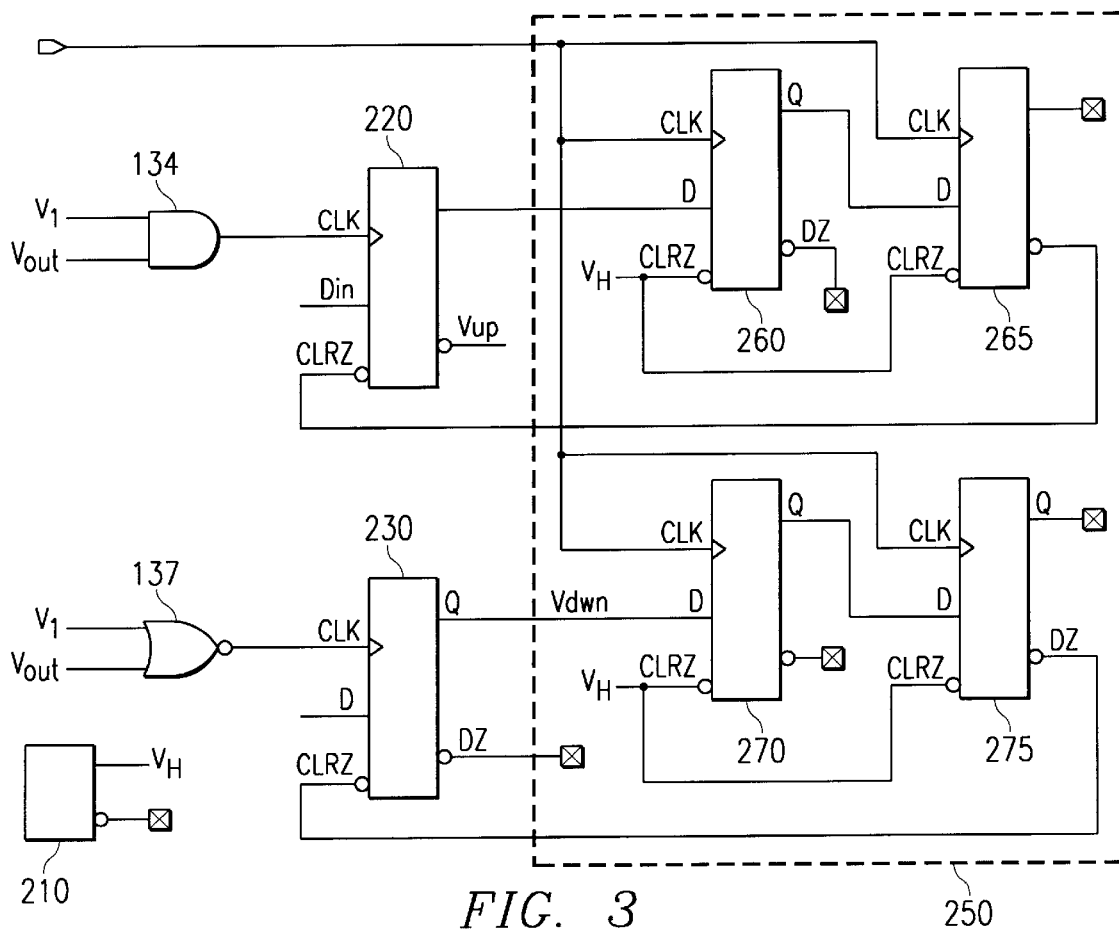
FIG. 3 illustrates an embodiment of a timing logic for implementation with the present invention.

The circuit logic typically comprises the invertor block and the logic block of FIG. 2. However, there may be times when a user of the invention is interested in preserving a high output voltage or a low output voltage for a predetermined number of clock cycles. Accordingly, FIG. 3 illustrates an embodiment of a timing logic for implementation with the present invention. The timing logic is typically implemented between, and thus coupled to, the logic block 130 and the pull up switch 170 and the pull down switch 180. Furthermore, the logic block typically consist of a plurality of time delay devices, such as flipflops. Accordingly, time delay is achieved between a NAND gate 134 and the pull up switch 170 by selectively cascading a first flipflop 220 to a second flipflop 260 and by coupling the second flipflop 260 to a third flipflop 265. Shown in FIG. 3 is a latch to pin which has a high voltage output of 5 volts illustrated as Vh. Vh is connected to the clrz input of the second flipflop 260 in the clrz input of the third flipflop 265. Thus, the first flip flop 220 detects the rising edge of a high output coming from the NAND gate 134. Then, the output of the first flip flop 220 becomes the input to the second flip flop 260 which is latched high when the next clock cycle is detected on the second latch 260. Thereafter, the output of the second latch 260 becomes the input to the third latch 265 and the next clock cycle catches the rising input into the third latch 265 at which time the inverted output of the third latch 265 becomes the clrz input of the first latch 220 which resets the first latch 220. It should be noted that although 2 flip flop latches are shown preserving the output of the NAND gate 134 for 2 clock cycles, additional flip flops may be placed within the timing logic to increase the number of cycles for which the output of the NAND gate 134 is held high. Likewise, the timing logic may consist of only one flip flop and thus, preserve the output of the NAND gate 134 for only one clock cycle. The inverted output of the first flip flop 220 is illustrated as Vup to symbolize the that the inverted output of the first flip flop 220 becomes the controlling voltage for the pull up switch 170.

The timing logic coupled between the NOR gate 137 and the pull down switch 180 is also illustrated in FIG. 3. A fourth latch 230 catches the falling output of the NOR gate 137 and sends the low output onto a fifth flip flop 270. The fifth flip flop 270 catches the low output at the next clock cycle and then produces an output cue which is low. During the next clock cycle a sixth flip flop 275 picks up the low input and then produces an output on its inverting output line which is connected to the clrz input of the fourth flip flop 230 so that the fourth flip flop 230 is reset. Accordingly, the pull down switch which is connected to the output cue of the fourth latch 230 is maintained low for at least 2 clock cycles. Thus, the flipflops guarantee that the output voltage is held for a minimum number of clock cycles, in this case 2 clock cycles. Furthermore, the flipflops could be arranged to guarantee that there is enough time to totally charge or discharge the capacitor. This is of particular importance in high frequency circuits.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A symmetrical filter, comprising:
   an input voltage node (Vin) for receiving an input signal;
   an intermediate node;
   a comparator coupled to a supply voltage node (Vsup), a ground voltage node (Vgnd), a capacitor voltage node (Vcap), and a reference voltage node (Vref);
   a voltage divider coupled between Vsup and the Vgnd and also connected to the Vref;
   a capacitor coupled between the Vgnd and the Vcap;
   a current regulator coupled to the Vsup, the Vgnd, and the Vcap;
   an invertor block coupled between the Vin and the intermediate node;
   a pull-up switch coupled between the Vsup and the Vcap;
   a pull down switch coupled between the Vgnd and the Vcap;
   a control logic coupled to the pull up switch, the pull down switch and the Vin; and
   an output node (Vout) coupled to the comparator for providing an output signal.

2. The symmetrical filter of claim 1 wherein the current regulator comprises:
   a first current source coupled between the Vsup and an input switch having an output connected to the Vcap and an input connected to the intermediate node; and
   a second current source coupled between the Vgnd and the input switch.

3. The symmetrical filter of claim 1 wherein the invertor block comprises:
   a first inverter coupled between and the Vin and the intermediate node; and
   a second inverter coupled between the intermediate node and the control logic.

4. The symmetrical filter of claim 1 wherein the control logic comprises:
   a NAND gate having a first input coupled to the inverter block, a second input coupled to Vout, and an output connected to the pull up switch; and
   a NORgate having a first input coupled to the inverter block, a second input coupled to the Vout, and an output connected to the pull down switch.

5. The symmetrical filter of claim 1 wherein the voltage divider comprises a first resistor coupled between Vsup and Vref, and a second resistor coupled between Vref and Vgnd.

6. The symmetrical filter of claim 1 wherein the pull up switch comprises a PMOS device.

7. The symmetrical filter of claim 1 wherein the pull down switch comprises a NMOS device.

8. The symmetrical filter of claim 5 wherein the first resistor is approximately 25 kilo ohms.

9. The symmetrical filter of claim 1 wherein the capacitor is approximately 50 pico Farads.

10. The voltage divider of claim 5 wherein the first resistor has the same value as the second resistor.

11. A logic circuit for controlling a symmetrical filter, the symmetrical filter having an intermediate node, an input node for receiving an input signal, a supply node, a ground node, a pull up switch, a pull down switch, and an output node for providing an output signal, the logic circuit comprising:
   a logic block coupled to the output node, the pull up switch, and the pull down switch; and
   an inverter block coupled to the input node, the intermediate node and the logic block; and
   the inverter block including:
      a first inverter coupled between the input node and the intermediate node; and
      a second inverter coupled between the intermediate node and the logic block.

12. The logic circuit of claim 11 wherein the logic block comprises:
   a NAND gate having a first input coupled to the inverter block, a second input coupled to the output node, and an output connected to the pull up switch; and
   a NOR gate having a first input coupled to the inverter block, a second input coupled to the output node, and an output connected to the pull down switch.

13. The logic circuit of claim 11 wherein the logic block comprises:
   a NAND gate having a first input coupled to the second inverter, a second input coupled to the output node, and an output connected to the pull up switch: and
   a NOR gate having a first input coupled to the second inverter, a second input coupled to the output node, and an output connected to the pull down switch.

14. The logic circuit of claim 11, further comprising:

a timing logic coupled to the logic block and wherein the timing logic comprises a plurality of flip-flops, the flip-flops being configured to delay the input signal received on the input node a predetermined number of clock cycles.

15. The logic circuit of claim 11, further comprising:

a first inverter coupled between the input node and the intermediate node;

a second inverter coupled between the intermediate node and the logic block;

a NAND gate having a first input coupled to the second inverter, a second input coupled to the output node, and an output connected to the pull up switch;

a NOR gate having a first input coupled to the second inverter, a second input coupled to the output node, and an output connected to the pull down switch; and a timing logic coupled to the logic block, the timing logic including:

a plurality of flip-flops, the flip-flops being configured to delay the processing of the input signal received on the input node a predetermined number of clock cycles.

16. A symmetrical filter, comprising:

an input port for receiving a filter input signal;

a pull-up switch;

a pull-down switch;

a capacitor coupled to the pull-up and pull-down switches and the input port;

a comparator having a first input coupled to the pull-up and pull-down switches, and an output port for providing a filter output signal; and control logic coupled to the pull-up switch and pull-down switches, the control logic controls the operation of the pull-up and pull-down switches in order to fully charge or fully discharge the capacitor.

17. A symmetrical filter, as defined in claim 16, wherein the pull-up switch is coupled to a supply voltage and the pull-down switch is coupled to ground.

\* \* \* \* \*